US011811411B2

(12) United States Patent
Das et al.

(10) Patent No.: US 11,811,411 B2
(45) Date of Patent: Nov. 7, 2023

(54) GLITCH FILTER SYSTEM

(71) Applicant: Texas Instruments Incorporated, Dallas, TX (US)

(72) Inventors: Abhijit Kumar Das, Plano, TX (US); Ryan Alexander Smith, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 17/734,227

(22) Filed: May 2, 2022

(65) Prior Publication Data

US 2022/0263500 A1  Aug. 18, 2022

Related U.S. Application Data

(63) Continuation of application No. 17/101,511, filed on Nov. 23, 2020, now Pat. No. 11,323,106.

(51) Int. Cl.
*H03K 5/1252* (2006.01)
*H03K 17/16* (2006.01)

(52) U.S. Cl.
CPC .......... *H03K 5/1252* (2013.01); *H03K 17/16* (2013.01)

(58) Field of Classification Search
CPC ....... H03K 5/1252; H03K 17/16; H03K 19/20
See application file for complete search history.

(56) References Cited

U.S. PATENT DOCUMENTS

| | | | |
|---|---|---|---|
| 5,289,060 A | 2/1994 | Elnashar et al. | |
| 7,667,500 B1 | 2/2010 | Alfke | |
| 10,418,980 B2 | 9/2019 | Kurokawa | |
| 2003/0137343 A1 | 7/2003 | Berka et al. | |
| 2013/0038359 A1 | 2/2013 | Zhang | |
| 2015/0048880 A1 | 2/2015 | Liu | |
| 2016/0071587 A1* | 3/2016 | Di Pendina | G11C 14/0081 365/158 |
| 2019/0379368 A1 | 12/2019 | Lin et al. | |

OTHER PUBLICATIONS

Lapshev et al.; "New Low Glitch and Low Power DET Flip-Flops Using Multiple C-Elements"; IEEE Transactions on Circuits and Systems—I: Regular Papers; vol. 63, Issue 10, Oct. 2016; 9 pages.

(Continued)

*Primary Examiner* — Jung Kim
(74) *Attorney, Agent, or Firm* — Michael T. Gabrik; Frank D. Cimino

(57) ABSTRACT

A glitch filter system includes an input stage to receive an input signal, a first output to provide a first digital signal, and a second output to provide a second digital signal. A C-element of such system receives the first digital signal and the second digital signal and provides a third digital signal at a first logic state in response to each of the first and second digital signals having a second logic state opposite the first logic state. An output latch of such system provides an output signal at the second logic state in response to the first logic state of the third digital. The output latch also receives the first and second digital signals to maintain the first logic state of the third digital signal in response to one of the first and second digital signals changing from the second logic state to the first logic state.

20 Claims, 2 Drawing Sheets

(56) References Cited

OTHER PUBLICATIONS

Najvirt et al.; "A Versatile and Reliable Glitch Filter for Clocks"; IEEE, 2015 25th International Workshop on Power and Timing Modeling, Optimization and Simulation (PATMOS); Dec. 7, 2015; 8 pages.
International Search Report and Written Opinion, for Application No. PCT/US 2021/060248, dated Feb. 17, 2022, 6 pages.

* cited by examiner

GLITCH FILTER SYSTEM

CROSS-REFERENCE TO RELATED APPLICATIONS

This application is a continuation of prior U.S. patent application Ser. No. 17/101,511, filed Nov. 23, 2020, which will issue as U.S. Pat. No. 11,323,106 on May 3, 2022, and which is incorporated herein by reference in its entirety.

TECHNICAL FIELD

This disclosure relates generally to electronic circuits, and more specifically to a glitch filter system.

BACKGROUND

Computer systems typically operate based on digital signals having binary logic states. In such systems that implement complementary metal-oxide semiconductors (CMOS) circuits, transistors can switch between activated and non-activated states based on the logic signals. However, in high speed applications, such as based on high speed clock signals, the time that it takes to switch between states can result in metastability of a given logic signal, resulting in an unexpected state or insufficient amplitude of a given logic signal. Glitch filters and other circuits can be implemented to mitigate metastability of a given logic signal. However, competing design considerations and logic processes can make it difficult to implement glitch filters in certain CMOS circuit applications.

SUMMARY

One example includes a glitch filter system. The system includes an input stage to receive an input signal, a first output to provide a first digital signal, and a second output to provide a second digital signal. A C-element receives the first digital signal and the second digital signal and provides a third digital signal at a first logic state in response to each of the first and second digital signals having a second logic state opposite the first logic state. An output latch provides an output signal at the second logic state in response to the first logic state of the third digital. The output latch also receives the first and second digital signals to maintain the first logic state of the third digital signal in response to one of the first and second digital signals changing from the second logic state to the first logic state.

Another example includes a glitch filter system. The system includes an input stage configured to receive an input signal and to generate a first digital signal and a second digital signal that are separate respective delayed versions of the input signal. The system also includes a C-element configured to receive the first and second digital signals and, in response to a logic state of each of the first and second digital signals being a first state, to set a logic state of a third digital signal at a control node to a second state opposite the first state. The system further includes an output latch coupled to the C-element and which is configured to set a logic state of an output signal to the first state in response to the second state of the third digital signal. The output latch can be further configured to maintain the logic state of the third digital signal at the control node to the second state in response to the first and second digital signals having separate respective logic states. The output latch can be configured to override the C-element in setting the logic state of the third digital signal.

Another example includes an integrated circuit (IC) chip. The IC includes a clock system that includes an oscillator circuit configured to generate an input signal and a glitch filter system. The glitch filter system includes an input stage having an input to receive the input signal, a first output to provide a first digital signal and a second output to provide a second digital signal. The first and second digital signals correspond to separate respective delayed versions of the input signal. The glitch filter system also includes a C-element having a first input to receive the first digital signal and a second input to receive the second digital signal. The C-element further includes an output to provide a third digital signal. The third digital signal can be provided at a first logic state in response to each of the first and second digital signals having a second logic state opposite the first logic state. The glitch filter system further includes an output latch having a first input coupled to the output of the C-element and having an output to provide an output clock signal at the second logic state in response to the first logic state of the third digital. The output latch further includes a second input to receive the first digital signal and a third input to receive the second digital signal to maintain the first logic state of the third digital signal in response to one of the first and second digital signals changing from the second logic state to the first logic state.

DETAILED DESCRIPTION

Figure 1:
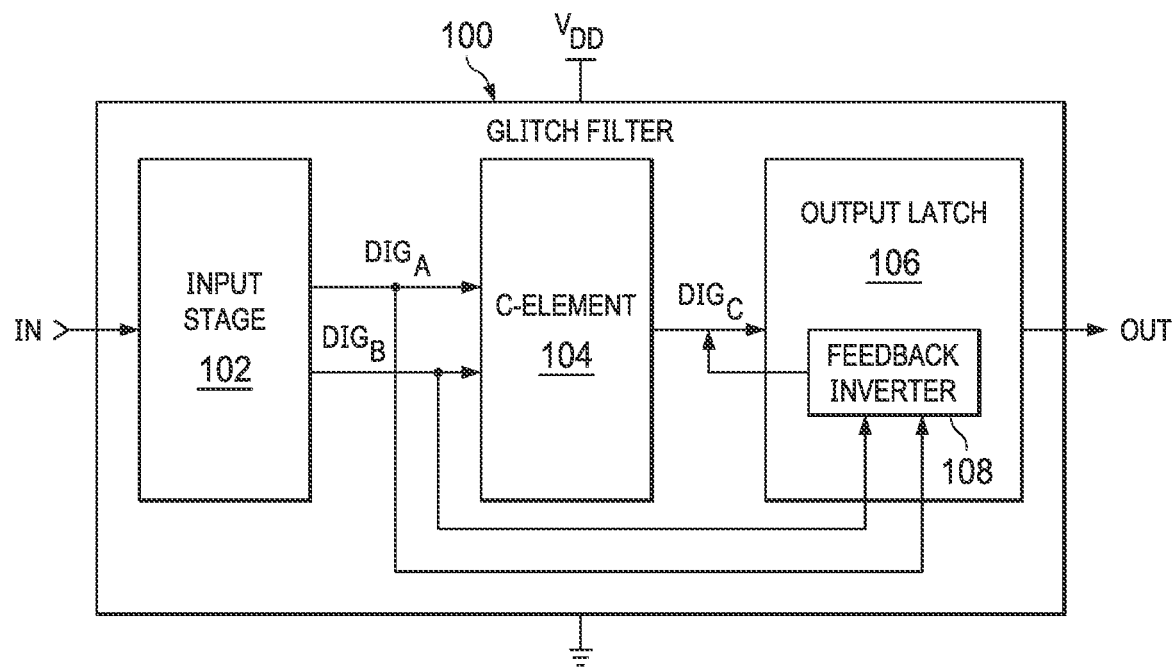
FIG. 1 illustrates an example of a glitch filter system.

This disclosure relates generally to electronic circuits, and more specifically to a glitch filter system. The glitch filter system can be implemented, for example, in a high-speed complementary metal-oxide semiconductors (CMOS) circuit, such as a clock circuit or a data circuit. The glitch filter system can thus mitigate glitches that can occur based on potential metastability of switching in generating a digital signal (e.g., a clock signal). The glitch filter system can include an input stage that provides first and second digital signals in response to an input signal. For example, the input signal can be provided as an oscillating digital signal provided from a local oscillator circuit, and the first and second digital signals can be separate respective delayed versions of the input signal. The glitch filter system also includes a C-element (e.g., a Muller C-element) that can operate as a modified inverter circuit that can provide a third digital signal at a control node, whereas the third digital signal can have a first logic state in response to both of the first and second digital signals having a second logic state opposite the first logic state.

The glitch filter system further includes an output latch. The output latch can include an output inverter that can invert the third digital signal to generate an output signal, such as to invert the first logic state of the third digital signal to provide the output signal at the second logic state. The output latch also includes a feedback inverter that is configured to control the logic state of the third digital signal based on the logic state of the output signal in response to the first and second digital signals having different logic states, and can be deactivated in response to the first and second digital signals $DIG_A$ and $DIG_B$ having the same logic state. Therefore, the feedback inverter can maintain the logic state of the third digital signal in response to one of the first and digital signals changing logic states. For example, the feedback inverter includes opposing inverters having a common output and which are controlled by the respective first and second digital signals. The opposing inverters can be arranged between transistors that are controlled by the output signal. Therefore, the feedback inverter can maintain the logic state of the output signal at the control node in response to a change of the logic state of one of the first and second digital signals relative to the other.

As an example, the output latch can be configured to override the C-element in maintaining the logic state of the third digital signal. As described herein, the term "override" with respect to controlling the state based on the output latch (e.g., the feedback inverter) and the C-element refers to the capability of the output latch to override the C-element in setting the logic state of the third digital signal at the control node in the event of the output latch and the C-element competing to set different logic states of the third digital signal. For example, the feedback inverter of the output latch can include transistors that are larger than the transistors of the C-element. Therefore, activation of the transistors of the feedback inverter can override transistors of the C-element that would compete for control of the logic state of the third digital signal at the control node.

FIG. 1 illustrates an example of a glitch filter system 100. The glitch filter system 100 can be implemented, for example, in a high-speed complementary metal-oxide semiconductors (CMOS) circuit, such as a clock circuit. As described herein, the glitch filter system 100 can mitigate glitches that can occur based on potential metastability of switching in generating a digital signal (e.g., a clock signal).

The glitch filter system 100 include an input stage 102 that is configured to provide a first digital signal $DIG_A$ and a second digital signal $DIG_B$ in response to an input signal IN. For example, the input signal IN can be provided as an oscillating digital signal provided from a local oscillator circuit (not shown in the example of FIG. 1). As an example, the input stage 102 can include one or more delay elements that can provide the first and second digital signals $DIG_A$ and $DIG_B$ as separate respective delayed versions of the input signal IN. The glitch filter system 100 also includes a C-element (e.g., a Muller C-element) 104 that can operate as a modified inverter circuit that can provide a third digital signal $DIG_C$ based on the first and second digital signals $DIG_A$ and $DIG_B$. Due to the inverting function of the C-element 104, the C-element 104 can provide the third digital signal $DIG_C$ at a first logic state in response to both of the first and second digital signals $DIG_A$ and $DIG_B$ having a second logic state opposite the first logic state. As described herein, the terms "first logic state" and "second logic state" are arbitrary with respect to each other, and are each used to designate opposite binary logic states with respect to each other. For example, the first logic state can be a logic-one while the second logic state is a logic-zero, or the first logic state can be a logic-zero while the second logic state is a logic-one.

The glitch filter system 100 further includes an output latch 106. The output latch 106 can include an output inverter that can invert the third digital signal $DIG_C$ to generate an output signal, shown in the example of FIG. 1 as a signal OUT. For example, the output inverter of the output latch 106 can invert the first logic state of the third digital signal $DIG_C$ to provide the output signal OUT at the second logic state. In the example of FIG. 1, the output latch 106 includes a feedback inverter 108 that is configured to control the logic state of the third digital signal $DIG_C$ based on the logic state of the output signal OUT. As shown in the example of FIG. 1, the first and second digital signals $DIG_A$ and $DIG_B$ are provided to the feedback inverter 108. For example, the feedback inverter 108 can control the logic state of the third digital signal $DIG_C$ in response to the first and second digital signals $DIG_A$ and $DIG_B$ having different logic states, and can be deactivated in response to the first and second digital signals $DIG_A$ and $DIG_B$ having the same logic state.

As an example, the feedback inverter 108 can drive the logic state of the third digital signal $DIG_C$ in response to one of the first and second digital signals $DIG_A$ and $DIG_B$ changing logic state relative to the other. As a result, the feedback inverter 108 can maintain the logic state of the third digital signal $DIG_C$ at a same state as was controlled by the C-element 104 in response to one of the first and digital signals changing logic states. As an example, the feedback inverter 108 can be configured to override the C-element 104 in maintaining the logic state of the third digital signal $DIG_C$. For example, the transistors of the feedback inverter 108 can be fabricated as larger transistors than the transistors of the C-element to override the C-element 104 for control of the logic state of the third digital signal $DIG_C$.

Therefore, based on the arrangement of the feedback inverter 108 as described herein, the glitch filter system 100 can substantially mitigate metastability in logic state of the third digital signal $DIG_C$, and thus of the output signal OUT. For example, in a typical glitch filter system that includes a C-element and a feedback inverter, the C-element is designed to override the feedback element to enable the C-element to change the logic state of the signal output from the C-element while the feedback inverter latches and inverts the logic state of the output signal. By designing the C-element to override the feedback inverter, the output latch can exhibit greater metastability in the switching of the output signal, such as based on the delay of the input stage being approximately equal to a switching time between state changes of the input signal. As described herein, the term "approximately" can include some deviation from an exact value (e.g., +/−5%). However, because the glitch filter system 100 implements the feedback inverter 108 as overriding the C-element 104, the metastability switching window of the switching of the output signal OUT can be significantly reduced. Also, by controlling the operation of the feedback inverter 108 based on the first and second digital signals $DIG_A$ and $DIG_B$, the feedback inverter 108 can be deactivated by the first and second digital signals $DIG_A$ and $DIG_B$ having the same logic state to relinquish control of the logic state of the third digital signal $DIG_C$ back to the C-element 104. Accordingly, the feedback inverter 108 in the glitch filter system 100 can mitigate metastability of the third digital signal $DIG_C$, and thus the output signal OUT, while still allowing for logic state change of the third digital signal $DIG_C$ by the C-element in response to the first and second digital signals $DIG_A$ and $DIG_C$ having the same logic state.

Figure 2:
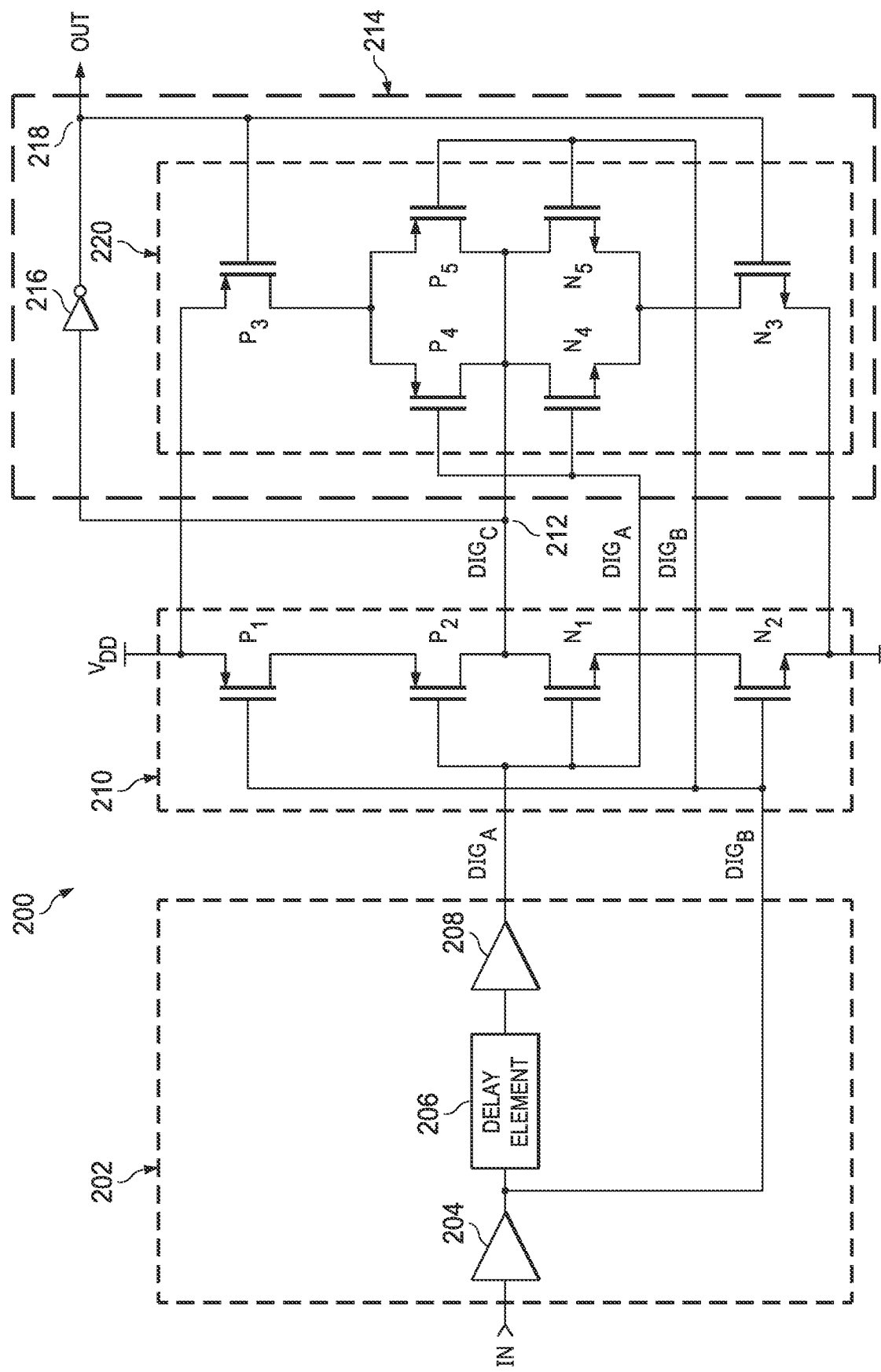
FIG. 2 illustrates an example of a glitch filter circuit.

FIG. 2 illustrates an example of a glitch filter system 200. The glitch filter system 200 can correspond to the glitch filter system 100 in the example of FIG. 1. Therefore, the glitch filter system 200 can mitigate glitches that can occur based on potential metastability of switching in generating a digital signal (e.g., a clock signal), similar to as described above.

The glitch filter system 200 include an input stage 202 that receives the input signal IN. For example, the input signal IN can be provided as an oscillating digital signal provided from a local oscillator circuit (not shown in the example of FIG. 2). The input stage 202 includes a first buffer 204, a delay element 206, and a second buffer 208. The input signal IN is provided through the first buffer 204 to provide the second digital signal $DIG_B$. The second digital signal $DIG_B$ is provided through the delay element 306 and the second buffer 208 to provide the first digital signal $DIG_A$. Each of the buffers 204 and 208 can have an inherent switching delay, and the delay element 306 can be configured or programmed to have a predetermined amount of delay. Therefore, the first and second digital signals $DIG_A$ and $DIG_B$ can each be separate respectively delayed versions of the input signal IN.

The glitch filter system 200 also includes a C-element (e.g., a Muller C-element) 210 that can operate as a modified inverter circuit. The C-element 210 includes a first P-channel field effect transistor (P-FET) $P_1$, a second P-FET $P_2$, a first N-channel field effect transistor (N-FET) $N_1$, and a second N-FET $N_2$. The first P-FET $P_1$ interconnects a high-voltage rail $V_{DD}$ and the second P-FET $P_2$ and is controlled by the second digital signal $DIG_B$. The second P-FET $P_2$ interconnects the first P-FET $P_2$ and a control node 212 and is controlled by the first digital signal $DIG_A$. The first N-FET $N_1$ interconnects the control node 212 and the second N-FET $N_2$ and is controlled by the first digital signal $DIG_A$. The second N-FET $N_2$ interconnects the first N-FET $N_1$ and a low-voltage rail (e.g., ground) and is controlled by the second digital signal $DIG_B$.

Therefore, based on the arrangement of the C-element 210, the C-element 210 can operate as a modified inverter to provide the third digital signal $DIG_C$ at the control node 212 at a first logic state in response to both of the first and second digital signals $DIG_A$ and $DIG_B$ having a second logic state opposite the first logic state. For example, if both the digital signal $DIG_A$ and $DIG_B$ have a logic-0 state, then the N_FETs $N_1$ and $N_2$ are both deactivated and the P-FETs $P_1$ and $P_2$ are both activated to couple the control node 212 to the high-voltage rail $V_{DD}$ to provide the third digital signal $DIG_C$ at the logic-1 state. Similarly, if both the digital signal $DIG_A$ and $DIG_B$ have a logic-1 state, then the P-FETs $P_1$ and $P_2$ are both deactivated and the N_FETs $N_1$ and $N_2$ are both activated to couple the control node 212 to the low-voltage rail to provide the third digital signal $DIG_C$ at the logic-0 state.

The glitch filter system 200 further includes an output latch 214. The output latch 214 includes an output inverter 216 that interconnects the control node 212 and an output node 218 on which the output signal OUT is provided. Therefore, the output inverter 216 can invert the logic state of the third digital signal $DIG_C$ to provide the output signal OUT at the output node 218. In addition, the output latch 214 includes a feedback inverter 220 that is arranged between the output node 218 and the control node 212. In the example of FIG. 2, the feedback inverter 220 receives the first and second digital signals $DIG_A$ and $DIG_B$ as inputs, along with the output signal OUT. Therefore, the feedback inverter 220 can control the logic state of the third digital signal $DIG_C$ based on the logic state of the output signal OUT and based on the first and second digital signals $DIG_A$ and $DIG_B$.

The feedback inverter 220 includes a first P-FET $P_3$, a second P-FET $P_4$, and a third P-FET $P_5$, as well as a first N-FET $N_3$, a second N-FET $N_4$, and a third N-FET $N_5$. The first P-FET $P_3$ interconnects the high-voltage rail $V_{DD}$ and the second and third P-FETs $P_4$ and $P_5$. The first N-FET $N_3$ interconnects the low-voltage rail and the second and third N-FETs $N_4$ and $N_5$. The first P-FET $P_3$ and the first N-FET $N_3$ are each controlled by the output signal OUT. The second and third P-FETs $P_4$ and $P_5$ interconnect the first P-FET $P_3$ and the control node 212, and the second and third N-FETs $N_4$ and $N_5$ interconnect the control node 212 and the first N-FET $N_3$. The second P-FET $P_4$ and the second N-FET $N_4$ are controlled by the first digital signal $DIG_A$ and the third P-FET $P_5$ and the third N-FET $N_5$ are controlled by the second digital signal $DIG_B$. Therefore, the arrangement of the second P-FET $P_4$ and the second N-FET $N_4$ and the arrangement of the third P-FET $P_5$ and the third N-FET $N_5$ can correspond, respectively, to opposing inverters between the first P-FET $P_3$ and the first N-FET $N_3$ and with commonly-coupled outputs at the control node 212.

As described above, the feedback inverter 220 can drive the logic state of the third digital signal $DIG_C$ at the control node 212 in response to one of the first and second digital signals $DIG_A$ and $DIG_B$ changing logic state relative to the other. As a result, the feedback inverter 220 can maintain the logic state of the third digital signal $DIG_C$ at a same state as was controlled by the C-element 210 in response to one of the first and digital signals changing logic states. For example, in response to the first and second digital signal $DIG_A$ and $DIG_B$ having a logic-1 state, the C-element 210 drives the logic state of the third digital signal $DIG_C$ to logic-0 (e.g., through the first and second N-FETs $N_1$ and $N_2$ of the C-element 210). The output inverter 216 inverts the logic-0 state of the third digital signal $DIG_C$ to provide the output signal OUT at a logic-1. The logic-1 state of the output signal OUT also activates the first N-FET $N_3$ of the output latch 214 and deactivates the first P-FET $P_3$. Also, the logic-1 state of the first and second digital signals $DIG_A$ and $DIG_B$ causes activation of the N-FETs $N_4$ and $N_5$ and deactivation of the P-FETs $P_4$ and $P_5$. Therefore, the control node 212 is driven to the low-voltage rail through the N-FETs $N_3$, $N_4$, and $N_5$. As a result, the feedback inverter 220 can likewise drive the third digital signal $DIG_C$ to logic-0 along with the C-element 210.

Based on the arrangement of the input stage 202, the second digital signal $DIG_B$ changes state before the first digital signal $DIG_A$ in response to a logic state change of the input signal IN. Therefore, in response to a change in logic state of the second digital signal $DIG_B$ to a logic-0 state, for a brief time defined by the delay times of the delay element 206 and the second buffer 208, while the first digital signal $DIG_A$ has a logic-1 state. As a result, in response to the first and second digital signal $DIG_A$ and $DIG_B$ having different logic states, the C-element 210 stops driving the logic state of the third digital signal $DIG_C$ based on the deactivation of the second N-FET $N_2$. In other words, the C-element 210 opens the paths between the control node 212 and the high-voltage rail $V_{DD}$ (e.g., based on the deactivated second P-FET $P_2$) and the low-voltage rail (e.g., based on the deactivated second N-FET $N_2$). However, the change of the second digital signal $DIG_B$ to the logic-0 state does not affect the feedback inverter 220 in driving the logic state of the third digital signal $DIG_C$, such that the feedback inverter 220 maintains the previous logic state of the third digital signal $DIG_C$. For example, the logic-0 state of the second digital signal $DIG_B$ causes activation of the third P-FET $P_5$ in the feedback inverter 220 and deactivation of the third N-FET $N_5$. However, the first and second N-FETs $N_3$ and $N_4$ of the feedback inverter 220 are still activated by the first digital signal $DIG_A$ and the output signal OUT, respectively, to sink the control node 212 to the low-voltage rail, and thus to maintain the third digital signal $DIG_C$ at the logic-0 state, and thus to maintain the output signal OUT at the logic-1 state.

As described above, the sizes (e.g., channel sizes) of the transistors of the feedback inverter 220 can be larger than the transistors of the C-element 210. Therefore, in response to the logic-states of the first and second digital signals $DIG_A$ and $DIG_B$ being different relative to each other as described above, the feedback inverter 220 can override the driving of the control node 212, and thus the logic state of the third digital signal $DIG_C$. For example, in the event that the delay times of the delay element 206 and the second buffer 208 approximately coincide with a change of state of the second digital signal $DIG_B$, a potential race condition, and thus metastable switching, can occur in the C-element 210 and the feedback inverter 220. However, because the N-FETs $N_3$, $N_4$, and $N_5$ and the P-FETs $P_3$, $P_4$, and $P_5$ can all have channel sizes that are greater than the channel sizes of the N-FETs $N_1$ and $N_2$ and the P-FETs $P_1$ and $P_2$, the feedback inverter 220 can override any potential attempt by the C-element 210 to change the logic state of the third digital signal $DIG_C$ differently from the maintained previous logic state. Accordingly, the metastability window of switching of the C-element 210 can be mitigated based on the larger transistors of the feedback inverter 220 overriding the transistors of the C-element 210, as opposed to typical glitch filter systems. Accordingly, the glitch filter system 200 can mitigate metastability in the switching between logic states relative to typical glitch filter systems.

After the duration of time defined by the delay times of the delay element 206 and the second buffer 208, the first digital signal $DIG_A$ can likewise switch to the logic-0 state, and thus the same logic-state as the second digital signal $DIG_B$. In response to the first and second digital signal $DIG_A$ and $DIG_B$ having a logic-0 state, the first and second digital signals $DIG_A$ and $DIG_B$ causes deactivation of the N-FETs $N_4$ and $N_5$ and activation of the P-FETs $P_4$ and $P_5$. However, given that the output signal OUT is initially still held at the logic-1 state, the output signal OUT maintains activation of the first N-FET $N_3$ of the feedback inverter 220. Therefore, the control node 212 does not have a current path to the high-voltage rail $V_{DD}$ (e.g., based on deactivation of the first P-FET $P_3$) or to the low-voltage rail (e.g., based on the deactivation of the N-FETs $N_4$ and $N_5$). As a result, the change of logic state of the first digital signal $DIG_A$ to the same logic state of the second digital signal $DIG_B$ causes deactivation of the feedback inverter 220, thus allowing the C-element to drive the logic state of the third digital signal $DIG_C$ at the control node 212.

For example, based on the logic-0 state of both the first and second digital signals $DIG_A$ and $DIG_B$, the P-FETs $P_1$ and $P_2$ are activated and the N-FETs $N_1$ and $N_2$ are deactivated to source the high-voltage rail $V_{DD}$ to the control node 212. Accordingly, the control node 212 switches to the logic-1 state based on the inverting operation provided by the C-element 210 and based on the deactivation of the feedback inverter 220. The output inverter 216 inverts the logic-0 state of the third digital signal $DIG_C$ to provide the output signal OUT at a logic-1. The logic-1 state of the output signal OUT also deactivates the first N-FET $N_3$ of the output latch 214 and activates the first P-FET $P_3$. As a result, the control node 212 is also provided a path to the high-voltage rail $V_{DD}$ through the P-FET $P_3$ and the P-FETs $P_4$ and $P_5$. As a result, the feedback inverter 220 can likewise drive the third digital signal $DIG_C$ to logic-0 after the C-element 210 initially sets the logic state of the third digital signal $DIG_C$. Because the feedback inverter 220 is deactivated prior to the C-element 210 setting the logic state of the third digital signal $DIG_C$, the C-element 210 does not need to override the feedback inverter 220 in setting the logic state of the third digital signal $DIG_C$, as is required in typical glitch filter systems. Thus, the arrangement of the feedback inverter 220 provides the capability for mitigating metastable switching of the glitch filter system 200 while facilitating proper operation of the C-element 210 to set the logic state of the output signal OUT, as described above.

Figure 3:
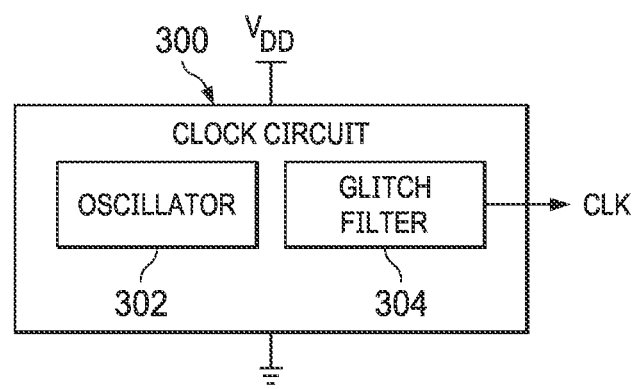
FIG. 3 illustrates an example of a clock system.

As described above, the glitch filter system 200 can be implemented in a clock system for generating a clock signal that can exhibit greater stability. FIG. 3 illustrates an example of a clock system 300. The clock system 300 can be implemented in any of a variety of digital circuits, such as for controlling a computer system or a wireless communications device. As an example, the clock system 300 can be included as or as part of an integrated circuit (IC). The clock system 300 includes a local oscillator 302 that can be configured as, for example, a crystal oscillator. The local oscillator 302 can generate an input signal, such as the input signal IN. The clock system 300 also includes a glitch filter system 304. As an example, the glitch filter system 304 can correspond to the glitch filter system 100 or the glitch filter system 200 in the respective examples of FIGS. 1 and 2. Therefore, the glitch filter system 304 can generate a clock signal CLK that can be the output signal OUT in the respective examples of FIGS. 1 and 2. Because the glitch filter system 304 can correspond to the glitch filter system 100 or the glitch filter system 200, the glitch filter system 304 can mitigate metastable switching to generate the clock signal CLK, as described above. Accordingly, the clock signal CLK can be generated as a much more stable clock signal, such as relative to clock signal generators that implement a typical glitch filter system.

Modifications are possible in the described embodiments, and other embodiments are possible, within the scope of the claims.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

What is claimed is:

1. A glitch filter system comprising:
   an input stage including a first output and a second output, the input stage including a delay element having an input and an output, the input being coupled to the first output of the input stage and the output being coupled to the second output of the input stage;
   a C-element including a first input coupled to the first output of the input stage, wherein the C-element further includes a second input coupled to the second output of the input stage, and wherein the C-element further includes an output; and
   an output latch including:
      a first P-type transistor including a gate coupled to the second output of the input stage, wherein the first P-type transistor further includes a drain coupled to the output of the C-element, and wherein the first P-type transistor further includes a source;
      a second P-type transistor including a gate coupled to the first output of the input stage, wherein the second P-type transistor further includes a drain coupled to the output of the C-element, and wherein the second P-type transistor further includes a source coupled to the source of the first P-type transistor;
      a first N-type transistor including a gate coupled to the second output of the input stage, wherein the first N-type transistor further includes a drain coupled to the output of the C-element, and wherein the first N-type transistor further includes a source; and
      a second N-type transistor including a gate coupled to the first output of the input stage, wherein the second N-type transistor further includes a drain coupled to the output of the C-element, and wherein the second N-type transistor further includes a source coupled to the source of the first N-type transistor.

2. The glitch filter system of claim 1,
   wherein the output latch further comprises an inverter including an input coupled to an output of the C-element, and
   wherein the inverter further includes an output.

3. The glitch filter system of claim 2,
   wherein the output latch further comprises a third P-type transistor including a gate coupled to the output of the inverter,
   wherein the third P-type transistor comprises a drain coupled to the source of the first P-type transistor and to the source of the second P-type transistor, and
   wherein the third P-type transistor comprises a source configured to couple to a high voltage rail.

4. The glitch filter system of claim 3, wherein the C-element comprises a fourth P-type transistor including a source configured to couple to the high-voltage rail.

5. The glitch filter system of claim 2,
   wherein the output latch further comprises a third N-type transistor including a gate coupled to the output of the inverter,
   wherein the third N-type transistor comprises a drain coupled to the source of the first N-type transistor and to the source of the second N-type transistor, and
   wherein the third N-type transistor comprises a source configured to couple to a low voltage rail.

6. The glitch filter system of claim 5, wherein the C-element comprises a fourth N-type transistor including a source configured to couple to the low-voltage rail.

7. The glitch filter system of claim 1,
   wherein the input stage includes a buffer including an input coupled to the output of the delay element, and
   wherein the buffer includes an output coupled to the second output of the input stage.

8. The glitch filter system of claim 7,
   wherein the input stage comprises an input configured to receive an input signal, wherein the input stage is configured to generate a first digital signal at the first output of the input stage,
   wherein the delay element is configured to generate a second digital signal at the second output of the input stage, and
   wherein the first and second digital signals are separate respective delayed versions of the input signal.

9. The glitch filter system of claim 8,
   wherein the C-element is configured to generate a third digital signal at the output of the C-element, and
   wherein the C-element is configured to generate the third digital signal at a first logic state in response to receiving both of the first and second digital signals at a second logic state opposite the first logic state.

10. The glitch filter system of claim 9, wherein the output latch is configured to maintain the first logic state of the third digital signal in response to one of the first and second digital signals changing from the second logic state to the first logic state.

11. The glitch filter system of claim 1, wherein the C-element comprises:
    a fourth P-type transistor including a gate coupled to the first output of the input stage, wherein the fourth P-type transistor includes a source configured to couple to a high-voltage rail; and
    a fourth N-type transistor including a gate coupled to the first output of the input stage, wherein the fourth N-type transistor includes a source configured to couple to a low-voltage rail.

12. The glitch filter system of claim 11,
    wherein the fourth P-type transistor includes a drain,
    wherein the fourth N-type transistor includes a drain,
    wherein the C-element comprises:
       a fifth P-type transistor including a gate coupled to the second output of the input stage, wherein the fifth P-type transistor includes a source coupled to the drain of the fourth P-type transistor; and
       a fifth N-type transistor including a gate coupled to the second output of the input stage, wherein the fifth N-type transistor includes a source coupled to the drain of the fourth N-type transistor.

13. The glitch filter system of claim 12,
    wherein the fifth P-type transistor includes a drain coupled to the output of the C-element, and
    wherein the fifth N-type transistor includes a drain coupled to the output of the C-element.

14. The glitch filter system of claim 1, wherein the C-element comprises:
    a fifth P-type transistor including a gate coupled to the second output of the input stage, wherein the fifth P-type transistor includes a drain coupled to the output of the C-element; and
    a fifth N-type transistor including a gate coupled to the second output of the input stage, wherein the fifth N-type transistor includes a drain coupled to the output of the C-element.

15. A glitch filter system comprising:
    an input stage including a first output and a second output, the input stage including a delay element having an input and an output, the input being coupled to the first output of the input stage and the output being coupled to the second output of the input stage;

a C-element configured to be coupled between a high-voltage rail and a low-voltage rail, wherein the C-element includes a first input coupled to the first output of the input stage, wherein the C-element further includes a second input coupled to the second output of the input stage, and wherein the C-element further includes an output; and an output latch including:
- a first P-type transistor including a gate coupled to the second output of the input stage, wherein the first P-type transistor further includes a drain coupled to the output of the C-element, and wherein the first P-type transistor further includes a source;
- a second P-type transistor including a gate coupled to the first output of the input stage, wherein the second P-type transistor further includes a drain coupled to the output of the C-element, and wherein the second P-type transistor further includes a source coupled to the source of the first P-type transistor;
- a first N-type transistor including a gate coupled to the second output of the input stage, wherein the first N-type transistor further includes a drain coupled to the output of the C-element, and wherein the first N-type transistor further includes a source;
- a second N-type transistor including a gate coupled to the first output of the input stage, wherein the second N-type transistor further includes a drain coupled to the output of the C-element, and wherein the second N-type transistor further includes a source coupled to the source of the first N-type transistor;
- an inverter including an input coupled to an output of the C-element, wherein the inverter further includes an output;
- a third P-type transistor including a gate coupled to the output of the inverter, wherein the third P-type transistor further includes a drain coupled to the sources of the first and second P-type transistors, and wherein the third P-type transistor further includes a source configured to couple to the high-voltage rail; and
- a third N-type transistor including a gate coupled to the output of the inverter, wherein the third N-type transistor further includes a drain coupled to the sources of the first and second N-type transistors, and wherein the third N-type transistor further includes a source configured to couple to the low-voltage rail.

16. The glitch filter system of claim 15, wherein the C-element is configured to conduct current from the high-voltage rail or to the low-voltage rail to set a logic state at the output of the C-element in response to a same logic state at each of the first and second outputs of the input stage.

17. The glitch filter system of claim 15, wherein the C-element comprises:
- a fourth P-type transistor including a gate coupled to the first output of the input stage, wherein the fourth P-type transistor includes a source configured to couple to the high-voltage rail; and
- a fourth N-type transistor including a gate coupled to the first output of the input stage, wherein the fourth N-type transistor includes a source configured to couple to the low-voltage rail.

18. The glitch filter system of claim 17,
wherein the fourth P-type transistor includes a drain,
wherein the fourth N-type transistor includes a drain, and
wherein the C-element comprises:
- a fifth P-type transistor including a gate coupled to the second output of the input stage, wherein the fifth P-type transistor includes a source coupled to the drain of the fourth P-type transistor; and
- a fifth N-type transistor including a gate coupled to the second output of the input stage, wherein the fifth N-type transistor includes a source coupled to the drain of the fourth N-type transistor.

19. The glitch filter system of claim 18,
wherein the fifth P-type transistor includes a drain coupled to the output of the C-element, and
wherein the fifth N-type transistor includes a drain coupled to the output of the C-element.

20. The glitch filter system of claim 15, wherein the C-element comprises:
- a fifth P-type transistor including a gate coupled to the second output of the input stage, wherein the fifth P-type transistor includes a drain coupled to the output of the C-element; and
- a fifth N-type transistor including a gate coupled to the second output of the input stage, wherein the fifth N-type transistor includes a drain coupled to the output of the C-element.

* * * * *